United States Patent
Li et al.

(10) Patent No.: US 10,134,599 B2
(45) Date of Patent: Nov. 20, 2018

(54) SELF-ANCHORED CATALYST METAL-ASSISTED CHEMICAL ETCHING

(71) Applicant: The Board of Trustees of the University of Illinois, Urbana, IL (US)

(72) Inventors: Xiuling Li, Champaign, IL (US); Jeong Dong Kim, Savoy, IL (US); Munho Kim, Champaign, IL (US); Lingyu Kong, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 15/441,745

(22) Filed: Feb. 24, 2017

(65) Prior Publication Data

US 2017/0243751 A1    Aug. 24, 2017

Related U.S. Application Data

(60) Provisional application No. 62/299,149, filed on Feb. 24, 2016.

(51) Int. Cl.
*H01L 21/306* (2006.01)
*H01L 21/027* (2006.01)
(Continued)

(52) U.S. Cl.
CPC .... *H01L 21/30604* (2013.01); *H01L 21/0337* (2013.01); *H01L 21/042* (2013.01);
(Continued)

(58) Field of Classification Search
None
See application file for complete search history.

(56) References Cited

U.S. PATENT DOCUMENTS 6,762,134 B2    7/2004  Bohn et al.
8,334,216 B2 *  12/2012  Lin ................. H01L 29/06
                                                257/618
(Continued)

FOREIGN PATENT DOCUMENTS

CN    102290332 B    3/2013

OTHER PUBLICATIONS

K. Balasundaram, P. K. Mohseni, Y. Shuai, D. Zhao, W. Zhou and X. Li, "Photonic crystal membrane reflectors by magnetic field-guided metal-assisted chemical etching," *Applied Physics Letters*, vol. 103, 214103, 2013.
(Continued)

*Primary Examiner* — Shamim Ahmed
(74) *Attorney, Agent, or Firm* — Brinks Gilson & Lione

(57) ABSTRACT

A method of metal-assisted chemical etching comprises forming an array of discrete metal features on a surface of a semiconductor structure, where each discrete metal feature comprises a porous metal body with a plurality of pores extending therethrough and terminating at the surface of the semiconductor structure. The semiconductor structure is exposed to an etchant, and the discrete metal features sink into the semiconductor structure as metal-covered surface regions are etched. Simultaneously, uncovered surface regions are extruded through the pores to form anchoring structures for the discrete metal features. The anchoring structures inhibit detouring or delamination of the discrete metal features during etching. During continued exposure to the etchant, the anchoring structures are gradually removed, leaving an array of holes in the semiconductor structure.

20 Claims, 7 Drawing Sheets

(51) Int. Cl.
| | |
|---|---|
| *H01L 21/3213* | (2006.01) |
| *H01L 21/285* | (2006.01) |
| *H01L 21/04* | (2006.01) |
| *H01L 21/768* | (2006.01) |
| *H01L 21/033* | (2006.01) |
| *H01L 21/308* | (2006.01) |

(52) U.S. Cl.
CPC ...... *H01L 21/0475* (2013.01); *H01L 21/2855* (2013.01); *H01L 21/28568* (2013.01); *H01L 21/3086* (2013.01); *H01L 21/30612* (2013.01); *H01L 21/32133* (2013.01); *H01L 21/32139* (2013.01); *H01L 21/76898* (2013.01)

(56) References Cited

U.S. PATENT DOCUMENTS

| | | | |
|---|---|---|---|
| 8,486,843 | B2 | 7/2013 | Li et al. |
| 8,568,877 | B2 | 10/2013 | Ferrari et al. |
| 8,912,637 | B1 * | 12/2014 | Zhang ............... H01L 23/49503 257/676 |
| 8,951,430 | B2 | 2/2015 | Li et al. |
| 8,980,656 | B2 | 3/2015 | Li et al. |
| 2011/0263119 | A1 | 10/2011 | Li et al. |
| 2013/0052762 | A1 | 2/2013 | Li et al. |
| 2015/0137321 | A1 | 5/2015 | Li et al. |
| 2015/0147885 | A1 | 5/2015 | Hildreth |
| 2015/0376798 | A1 | 12/2015 | Sakdinawat et al. |
| 2017/0005207 | A1 | 1/2017 | Li et al. |

OTHER PUBLICATIONS

C. Chang and A. Sakdinawat, "Ultra-high aspect ratio high-resolution nanofabrication for hard X-ray diffractive optics", *Nature Communications*, vol. 5, 4243, 2014.

R. C. Tiberio, M. J. Rooks, C. Chang, C. F. Knollenberg, E. A. Dobisz and A. Sakdinawat, "Vertical directionality-controlled metal-assisted chemical etching for ultrahigh aspect ratio nanoscale structures", *Journal of Vacuum Science & Technology B*, 32, 06FI01, 2014.

B. Wu, A. Kumar and S. Pamarthy, "High aspect ratio silicon etch: A review", *Journal of Applied Physics*, vol. 108, 051101, 2010.

A. Vlad, A. Frölich, T. Zebrowski, C. A. Dutu, K. Busch, S. Melinte, M. Wegener and I. Huynen, "Direct transcription of two-dimensional colloidal crystal arrays into three dimensional photonic crystals", *Advanced Functional Materials*, vol. 23, 1164-1171, 2013.

G. Barillaro, A. Nannini, M. Piotto, "Electrochemical etching in HF solution for silicon micromachining", *Sensors and Actuators A: Physical*, vol. 102, 195-201, 2002.

L. Li, X. Zhao, C. P. Wong, "Deep etching of single- and polycrystalline silicon with high speed, high aspect ratio, high uniformity and 3D complexity by electric bias-attenuated metal-assisted chemical etching", *ACS Applied Materials Interfaces*, vol. 6, 16782-16791, 2014.

\* cited by examiner

SELF-ANCHORED CATALYST METAL-ASSISTED CHEMICAL ETCHING

RELATED APPLICATION

The present patent document claims the benefit of the filing date under 35 U.S.C. § 119(e) to U.S. Provisional Patent Application Ser. No. 62/299,149, which was filed on Feb. 24, 2016, and is hereby incorporated by reference in its entirety.

FEDERALLY SPONSORED RESEARCH

This invention was made with government support under CMMI 1462946 awarded by National Science Foundation. The Government has certain rights in the invention.

TECHNICAL FIELD

The present disclosure is related generally to wet etching and more specifically to metal-assisted chemical etching.

BACKGROUND

The fabrication of semiconductor nanostructures is becoming increasingly important for both research and industrial applications. Emerging technologies and devices, such as photonic crystals, functional metamaterials and through-silicon vias (TSVs), require high resolution and high aspect ratio nanofabrication techniques for enhanced performance. Unfortunately, current nanofabrication techniques, such as plasma etching, deep reactive ion etching and ion etching, suffer from various shortcomings, including the formation of features with rough scalloped side walls and/or surface damage and defects that degrade the device performance significantly.

Metal-assisted chemical etching (MacEtch) is a wet but directional etching technique for etching features in semiconductors. In a typical MacEtch process, a patterned metal film is applied to a semiconductor surface to act as a catalyst to guide etching of the underlying semiconductor when exposed to a suitable etchant, which typically includes an oxidant, such as $H_2O_2$ or $KMnO_4$, and an acid, such as HF. During etching, the metal film sinks into the underlying semiconductor, effectively carving out 3D semiconductor structures according to the 2D pattern of the metal film. The role of the catalyst may including reducing the oxidant and selectively enhancing the oxidation rate of the underlying semiconductor by hole carrier injection. The role of the acid may include dissolving the oxidized semiconductor to allow continued oxidation and etching in a direction normal to the semiconductor-metal interface. A challenge with MacEtch, when the patterned metal film takes the form of discrete metal features such as metal particles or metal disks, is that uncontrolled lateral motion or delamination of the discrete metal features may occur during etching, leading to structural defects and/or non-vertical features in the etched semiconductor.

BRIEF SUMMARY

A method of metal-assisted chemical etching comprises forming an array of discrete metal features on a surface of a semiconductor structure, where each discrete metal feature comprises a porous metal body with a plurality of pores extending therethrough and terminating at the surface of the semiconductor structure. The semiconductor structure is exposed to an etchant, and the discrete metal features sink into the semiconductor structure as metal-covered surface regions are etched. Simultaneously, uncovered surface regions are extruded through the pores to form anchoring structures for the discrete metal features. The anchoring structures inhibit detouring or delamination of the discrete metal features during etching. During continued exposure to the etchant, the anchoring structures are gradually removed, leaving an array of holes in the semiconductor structure.

DETAILED DESCRIPTION

FIGS. 1A-1F are schematics showing an improved MacEtch process, referred to as self-anchored catalyst MacEtch (or SAC-MacEtch), where nanoscale "anchors" produced during etching are used to reduce lateral detouring and/or delamination of the discrete metal features that catalyze etching.

Figure 1A:
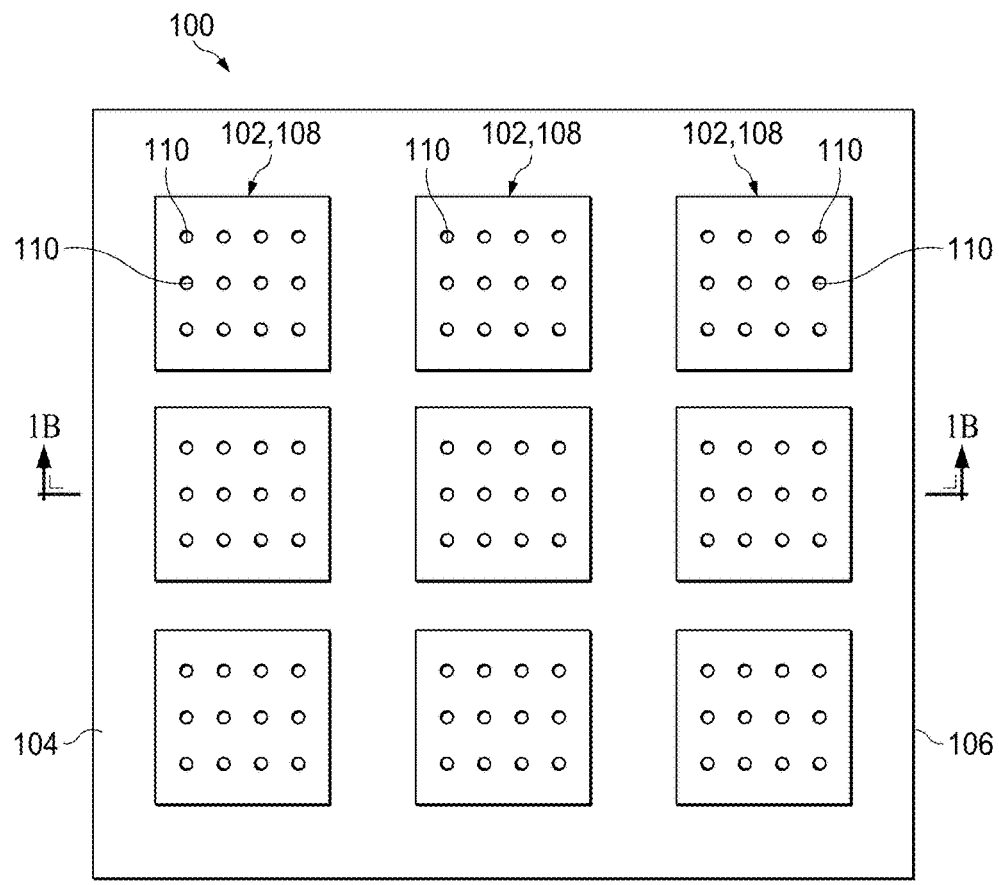
FIGS. 1A-1F are schematics of an exemplary self-anchored catalyst MacEtch (SAC-MacEtch) process.
Figure 1B:
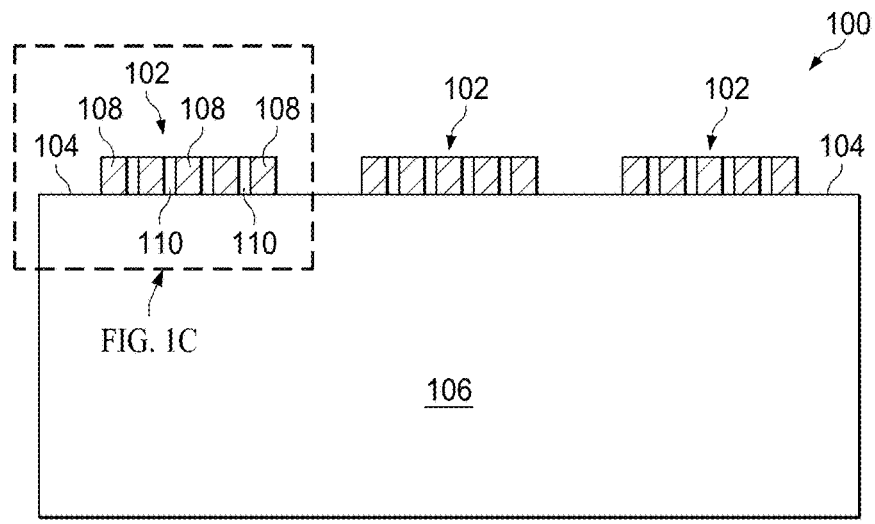

Referring first to FIGS. 1A and 1B, the method entails forming an array 100 of discrete metal features 102 on a surface 104 of a semiconductor structure (e.g., semiconductor substrate) 106, where each discrete metal feature 102 comprises a porous metal body 108 with a plurality of pores 110 extending therethrough. The pores 110 terminate at the surface 104 of the semiconductor structure 106. In this example, the array is a uniform 3×3 array of nine discrete metal features 102; however, other sizes and shapes are possible, as discussed below. Since the discrete metal features 102 catalyze etching, they are sometimes referred to as catalysts.

Figure 1C:
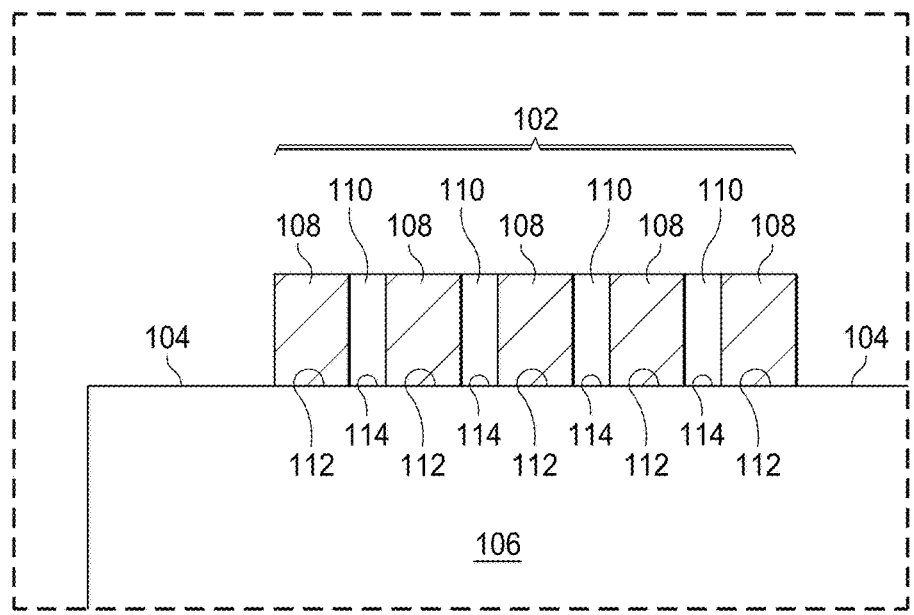
Figure 1D:
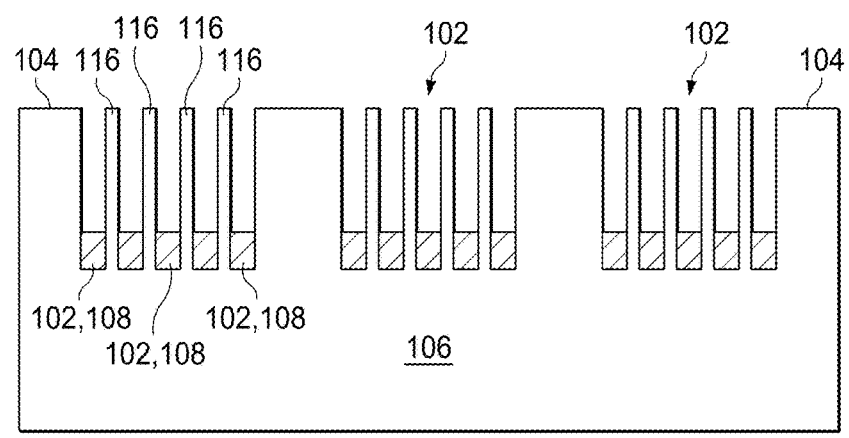

Referring now to FIGS. 1C and 1D, when the semiconductor structure 106 is exposed to an etchant, metal-covered surface regions 112 are etched (by MacEtch) and the discrete metal features 102 containing through-thickness pores 110 sink into the semiconductor structure 106. Simultaneously, uncovered surface regions 114, which are substantially unaffected by MacEtch, are extruded through the pores 110. Extrusion of the uncovered surface regions 114 creates anchoring structures 116 that can inhibit detouring or delamination of the discrete metal features 102 during etching, as shown in FIG. 1D.

Figure 1E:
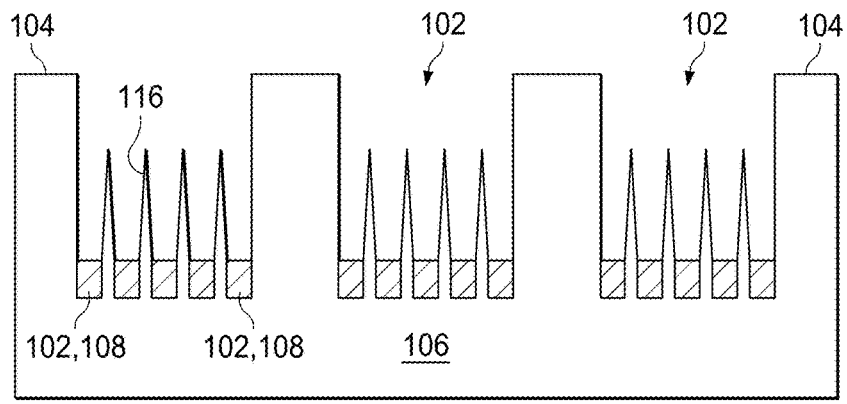

With continued exposure to the etchant, the anchoring structures 116 may be gradually removed, as illustrated in FIG. 1E. During MacEtch, unconsumed holes may accumulate in the anchoring structures 116 and their surfaces may be oxidized. Due to the oxidation, the anchoring structures 116 may be chemically thinned and shortened by exposure to the etchant. Ultimately, an array 120 of holes 118 of a desired depth may be left in the semiconductor structure 106.

The array 120 of holes 118 may extend partway or entirely through the semiconductor structure 106, and may reflect the two-dimensional (2D) size, shape and pattern of the array 100 of discrete metal features 102 originally deposited on the surface 104. In addition, due to the lateral stability provided by the anchoring structures 116 during etching, the base of each hole 118 may be positioned directly below the original position on the surface 104 of each of the respective discrete metal features 102, and the wall(s) defining each hole 118 may be substantially vertical (e.g., within about 5° or preferably within about 1° of a direction normal to the surface 104).

The discrete metal features 102 formed on the surface 104 may take the form of particles, disks, dots, rods or other shapes with through-thickness pores. The porous metal body 108 that forms each discrete metal feature may comprise one or more metals selected from the group consisting of: Ag, Al, Au, Co, Cr, Cu, Fe, Hf, Ir, Mn, Mo, Pd, Pt, Rb, Re, Rh, Ta, Ti, V, W, Zn, and Zr. Typically, the discrete metal features have a larger width (or diameter) than thickness, where thickness is measured in a direction normal to the surface of the semiconductor structure. Each of the discrete metal features may have a width or diameter in the range from about 50 nm to about 1,000 microns. For some semiconductor device applications where small-scale holes or vias are required, the width or diameter may be in the range from about 50 nm to less than 50 microns, or from 50 nm to about 1 micron. For other applications where larger holes or vias are needed, the width or diameter may be in the range from about 50 microns to about 1,000 microns, or from about 300 microns to about 1,000 microns.

The discrete metal features 102 may be arranged in an ordered or disordered two-dimensional array 100 on the surface 104 of the semiconductor structure 106. The arrays may range in size from a 2×2 array including four discrete metal features to an i×j array including tens, hundreds or thousands of the discrete metal features, where i and j are the same or different integers having any positive value.

While each of the discrete metal features—which individually define the region over which etching occurs—may have a width or diameter ranging from tens of nanometers to hundreds of microns (or larger), each of the pores present in the discrete metal features is typically less than a few microns in lateral size, and in some cases may be less than about 100 nm in lateral size. In some embodiments, the lateral size of the pores, where the lateral size refers to a width or diameter, may be about 2 microns or less, about 500 nm or less, about 200 nm or less, about 100 nm or less, or about 50 nm or less, and is typically at least about 5 nm. This micro- or nanoscale size ensures that the anchoring structures formed during MacEtch can be chemically etched away within a reasonable time duration. Anchoring structures having thicknesses in the nanoscale range (e.g., about 100 nm or less) may be preferred to ensure complete removal during etching.

Because the fine size of the anchoring structures limits the strength achievable per anchor, it is beneficial to utilize a high density of anchoring structures for restraining the discrete metal features during etching, and thus to incorporate a high density of pores in the discrete metal features. Typical pore areal densities, or areal coverage of the pores (in terms of total area of the pores over the area of the respective discrete metal feature and multiplied by 100), may be from 5% to about 30%, and more typically from about 10% to about 25%. The pore areal density and pore size may be determined from image analysis of transmission or scanning electron micrographs. In addition to defining the size and number of anchors formed during etching, the pores provide pathways for the etching solution to access the center of each metal-covered surface region. Without these additional pathways, etching carried out beneath the discrete metal features, particularly large features of hundreds of microns in width or diameter, may be nonuniform with etching of the edges proceeding more quickly than the centers.

Figure 1F:
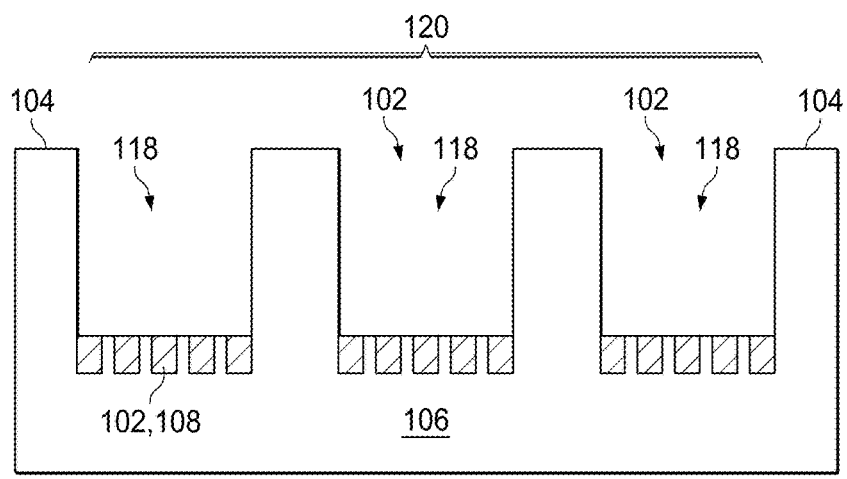

As mentioned above, the anchoring structures, which are also referred to as anchors and/or nanowires in this disclosure, have lateral sizes (or thicknesses) and number densities determined by the pore size and distribution in the discrete metal features. Typically, the anchoring structures have a large aspect ratio where the length of each anchoring structure is much larger than the thickness (i.e., width or diameter). However, since the anchoring structures may experience chemical etching as the metal-covered surface regions undergo MacEtch, the thicknesses and/or lengths of the anchoring structures may be gradually diminished as etching proceeds, as illustrated in FIGS. 1D-1F.

Typically, SAC-MacEtch is carried out for a time duration that depends on the desired hole depth as well as the speed at which the anchoring structures are removed by chemical etching. The time duration of the etching process typically ranges from about several minutes to several hours. For example, etching may be carried out for at least about 1 minute, at least about 5 minutes, at least about 10 minutes, or at least about 30 minutes. The etching may proceed for up to 100 hours, up to 30 hours, up to 10 hours, or up to 1 hour.

The vertical etch rate may depend on the discrete metal feature array dimensions (e.g., diameter, pitch) and solution concentration (e.g., HF, $H_2O_2$). For example, for an array of discrete metal features, each having a diameter of about 100 nm at fixed pitch of 1 μm, that undergoes MacEtch using an etching solution including 20 ml HF, 20 ml $H_2O_2$, 16 ml DI and 16 ml IPA, the etch rate is about 40 nm/min. When an array of discrete metal features each having a diameter of about 900 nm is etched under the same conditions, the etch rate increases to about 320 nm/min. For arrays having discrete metal feature diameters in the range of about 100 nm to about 900 nm, a trend of increasing etch rate with increasing feature diameter is found. Generally speaking, etch rates for SAC-MacEtch may be from about 10 nm/min to about 10 micron/min, although higher and lower etch rates are possible, and etch rates from about 20 nm/min to about 2 microns/min, or from about 20 nm/min to about 500 nm/min are typical.

The semiconductor structure or substrate that undergoes SAC-MacEtch includes at least one semiconductor, which may be doped, semi-insulating, intrinsic or undoped. The semiconductor(s) that make up the semiconductor structure (and the anchoring structures formed during etching) may be selected from the group consisting of Si, Ge, GaAs, InAs, InSb, GaN, GaP, GaSb, GaAsP, GaAsN, GaInAs, GaInP, AlGaAs, AlGaIn, AlGaP, AlGaInP, InGaAs, InGaN, InGaP, InGaSb, InAsSb, AlN, AlGaN, ZnSe, diamond (C), $Ga_2O_3$ and SiC. Suitable dopants include n- and p-dopants known in the art. The semiconductor structure may include at least one interface, where the interface represents a junction between two different materials and/or crystal structures. Etching may proceed across the interface(s) in the semiconductor structure.

The discrete metal features, each comprising a porous metal body with through-thickness pores, may be formed using any of a number of methods. For example, vapor deposition and patterning methods may be employed to form a porous metal film on the surface of the semiconductor structure and then to carve out the array of the discrete metal features from the porous metal film. The vapor deposition may entail thermal evaporation or sputtering of the desired metal(s). The porosity of the discrete metal features may be manipulated by controlling the deposition rate and/or the thickness of the deposited porous metal film. In general, an increase in poro size may be achieved with a decreased thickness of the deposited metal film (and thus the discrete metal features) and/or with an increase in the deposition rate.

For example, an array of 500 nm-diameter gold disks of 10 nm in thickness formed at a deposition rate of 1.5 Å/s is found to include, after undergoing MacEtch, nanowire anchors of about 20 nm to about 50 nm in thickness, which is indicative of pores of 20-50 nm in size in the gold disks. In contrast, an array of 500 nm-diameter gold disks of only 5 nm in thickness deposited at the same deposition rate and MacEtched in the same solution includes nanowire anchors of about 90 nm to 150 nm in thickness, which is indicative of pores of 90-150 nm in size in the gold disks.

As shown by the data presented below in Table 1, if the film thickness is too high for a given deposition rate, a continuous metal film with substantially no porosity may be obtained. On the other hand, if the film thickness is too low for a given deposition rate, a discontinuous metal film with interconnected pores (as opposed to discrete pores) may be the result. To ensure that the desired porosity (discrete pores of a suitable size) is obtained, the deposited metal film may have a very low thickness of about 20 nm or less, about 10 nm or less, or about 5 nm or less, and typically greater than 2 nm, or greater than 3 nm. In addition, the deposition may be carried out at a sufficiently high rate, such as at least about 0.2 angstrom per second, at least about 0.5 angstrom per second, at least about 1 angstrom per second, at least about 1.5 angstroms per second, or at least about 3 angstroms per second, and typically up to about 5 angstroms per second of deposited metal, although higher deposition rates are also possible.

TABLE 1

Process Parameters Versus Pore Size

| Gold thickness (nm) | Deposition Rate (Å/s) | Estimated pore size (nm) |
|---|---|---|
| 10 | 0.2 | Continuous film (no porosity) |
| 5 | 0.2 | ~50 |
| 10 | 1.5 | ~20~50 |
| 5 | 1.5 | ~90~150 |
| <2~3 | 1.5 | Discontinuous film (interconnected porosity) |

Another approach to depositing the porous metal film may entail vapor deposition of a mixture or alloy of two different immiscible metals, such as gold and nickel. Due to the immiscibility of the metals, the deposited thin film may comprise islands of one of the metals (e.g., nickel), dispersed in the other metal (e.g., gold). The islands may then be preferentially removed by etching to form the porous metal film (e.g., a gold film), which may have nanoscale pores. The porous metal film can then be patterned on a larger scale using methods known in the art to form the array of discrete metal features.

In one example, patterning the porous metal film may be accomplished by depositing a polymer coating (e.g., a resist) on the surface of the semiconductor structure prior to depositing the porous metal film, and then lithographically patterning the polymer coating using e-beam lithography or photolithography to include an array of discrete shapes that mimic the discrete metal features to be formed. After the lithographic patterning, the porous metal film may be deposited on the polymer coating, and one or more exposed or unexposed portions of the polymer coating may be lifted off. Thus, the porous metal film may be patterned and the array of discrete metal features formed on the surface.

As discussed above, during etching, the discrete metal features sink into the semiconductor structure to produce an etched body that has, at any given etched depth, a 2D areal geometry complementary to that of the overlying discrete metal features. Ideally, under controlled etch conditions, only the semiconductor material directly underneath the patterned metal contact layer is removed. The sidewall roughness of MacEtch-produced semiconductor structures may be determined by the edge roughness of the discrete metal features.

Suitable etchants for the MacEtch process include an oxidizer and an acid at an appropriate molar ratio, as described in detail in U.S. Pat. No. 8,486,843, entitled "Method of Forming Nanoscale Three-Dimensional Patterns in a Porous Material," and U.S. Pat. No. 8,951,430, entitled "Metal-Assisted Chemical Etching to Produce III-V Semiconductor Nanostructures," both of which were incorporated by reference above. The etchant may be selected so that it selectively removes metal-covered surface regions and does not remove uncovered surface regions. Suitable oxidants may include, for example, $H_2O_2$, $KMnO_4$ and/or $K_2S_2O_8$. Suitable acids may include, for example, HF and/or $H_2SO_4$. The etching may be carried out at a temperature from about 0° C. to about 60° C., or at room temperature. The molar ratio of the acid and oxidizer may influence the rate at which the anchoring structures are removed during MacEtch of the semiconductor structure.

EXAMPLES

SAC-MacEtch Across Interfaces

The application of SAC-MacEtch to a semiconductor substrate including at least one interface is described in the following examples.

In the first example, the semiconductor substrate includes 2 μm-thick polysilicon over silicon oxide on boron-doped p-type (100)-oriented crystalline silicon having a resistivity of 1-50 Ω·cm, and thus the semiconductor structure includes two interfaces. The semiconductor substrate is first subjected to standard RCA cleaning processes, including organic contaminant removal in 1:1:5 ammonium hydroxide ($NH_4OH$): hydrogen peroxide ($H_2O_2$): deionized water (DI) at 80° C., native oxide stripe in 1:10 buffer oxide etchant (BOE), and ionic contaminant removal in 1:1 hydrogen chloride (HCl): deionized water (DI).

After cleaning the semiconductor substrate, a polymer coating is deposited and lithographically patterned. The polymer coating (80 nm in thickness) is formed by spin coating 950 poly methyl methacrylate (PMMA) in 2 percent anisole at 2500 rpm for 30 seconds. Then, electron beam lithography with a 10 kV beam voltage and 20 μm aperture is used for exposure of an array of submicron-scale dots. The patterns are developed in 1:3 methyl isobutyl keton (MIBK): isopropyl alcohol (IPA) for 2 minutes at room temperature. Then, two separate metal films, one comprising porous gold (5 nm in thickness) and the other comprising nonporous gold (10 nm in thickness), are deposited under suitable conditions using electron beam evaporation. After the deposition, resist remover (Remover PG) is used for lift-off (30 minutes at 60° C.) to form an array of discrete metal features from each metal film.

One array, which may be referred to as the "porous array," includes discrete metal features that each comprise a porous gold body with through-thickness pores, and the other array, which may be referred to as the "nonporous array," includes discrete metal features each comprising a nonporous gold body that is completely or substantially devoid of pores. The porous and nonporous arrays include discrete metal features of 700 nm in diameter (or width) and 1 micron in pitch in this example. Other nonporous arrays are fabricated having other metal feature dimensions, including 700 nm in diameter with a 1 micron pitch, 800 nm in diameter with a 1 micron pitch, and 400 nm in diameter with a 1 micron pitch.

The porous and nonporous arrays then undergo metal-assisted chemical etching for 10 minutes in identical etching solutions of 20 ml 49% hydrofluoric acid, 20 ml 30% $H_2O_2$, 16 ml isopropyl alcohol (IPA), and 16 ml DI. After etching, the arrays are inspected with a Hitachi S-4800 scanning electron microscope (SEM). Cross-sections of the etched arrays are characterized with a FEI DB 235 dual-beam focused ion beam (FIB) system.

Figure 2A:
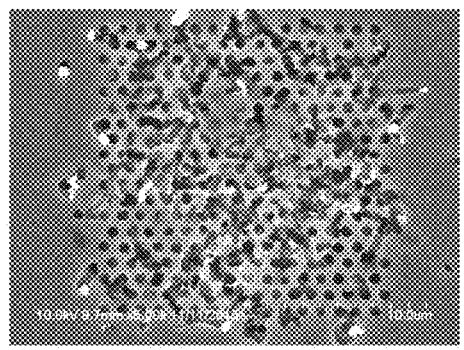
FIGS. 2A and 2B show top view scanning electron microscope (SEM) images of exemplary nonporous and porous arrays, respectively, after etching. The porous array (FIG. 2B) includes 700 nm-diameter discrete metal features with a 1 μm pitch, where each discrete metal feature includes through-thickness pores that allow anchoring structures to form during etching. The nonporous array of FIG. 2A includes 700 nm-diameter discrete metal features with a 1 μm pitch, where each discrete metal feature is substantially devoid of through-thickness pores, and thus anchoring structures are not formed.
Figure 2B:
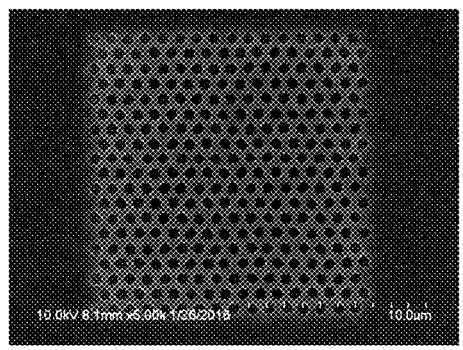

FIGS. 2A and 2B show top view SEM images of the nonporous and porous arrays including 700 nm-diameter discrete metal features with a 1 μm pitch after etching. Severe detouring of the discrete metal features is observed in the nonporous array (FIG. 2A), while little to no detouring can be observed in the porous array (FIG. 2B). The detouring may be caused by vigorous hydrogen bubble formation between the semiconductor substrate and the discrete metal features from the redox reaction that occurs during etching, and/or from an uneven etch rate originating from the grain boundaries of the polycrystalline structure. During etching of the porous array, nanowires are formed as material from the semiconductor substrate is extruded through the pores in the porous metal bodies, and these nanowires serve to physically anchor the discrete metal features, inhibiting delamination and lateral motion (detouring).

Figure 3A:
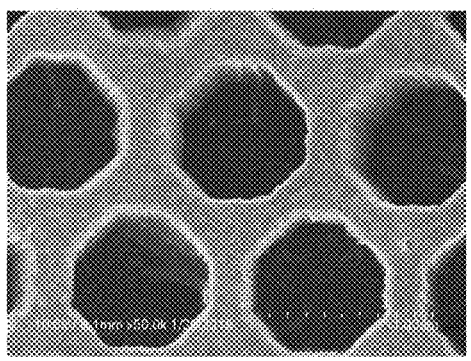
FIGS. 3A and 3B show low and high magnification SEM images of the initial stage of SAC-MacEtch with a porous array including 800 nm-diameter discrete metal features and a 1 μm pitch.
Figure 3B:
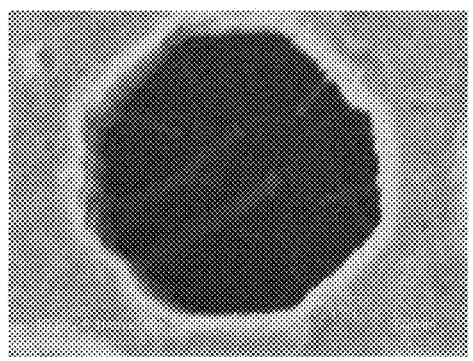

FIGS. 3A and 3B show low and high magnification SEM images of the initial stage of SAC-MacEtch with the porous array including 800 nm-diameter discrete gold features and a 1 μm pitch. The images show that sub 50-nm nanowires or anchors are formed through the pores in the gold features that catalyze the etching process. These anchors, which may themselves be porous, are chemically etched over longer durations of SAC-MacEtch.

Figure 4A:
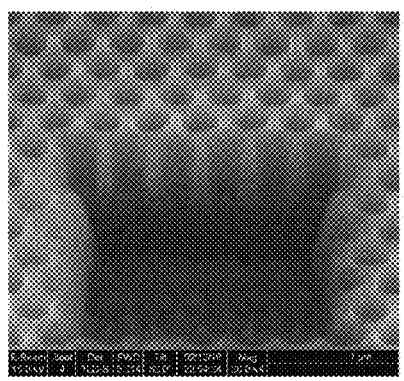
FIGS. 4A and 4B show tilted cross-sectional SEM images of SAC-etched porous arrays including 800 nm- and 400 nm-diameter discrete gold features with a 1 μm pitch.
Figure 4B:
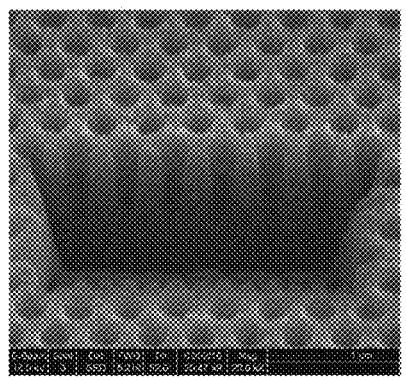

FIGS. 4A and 4B show 52-degree tilted cross-sectional SEM images after FIB of the porous arrays including 800 nm- and 400 nm-diameter discrete gold features with a 1 μm pitch, after SAC-MacEtch as described above. During etching, nanowires extruded through the pores of the porous gold may be chemically etched from hole accumulation from the tip to the base of the nanowires. It is observed that the etch rate of the porous array is uniform, even though the size and number of nanowires formed in the discrete metal features may not be uniform.

Figure 5A:
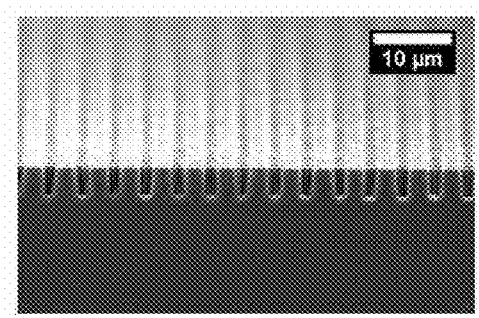
FIGS. 5A and 5B show low and high magnification cross-sectional SEM images of a 2 μm-diameter, 2 μm-spacing (4 μm-pitch) via array formed after SAC-MacEtch.

Additional examples of the application of SAC-MacEtch to semiconductor structures including multiple interfaces can be seen in FIG. 5A, where a silicon-on-insulator (SOI) substrate comprises polycrystalline silicon over silicon dioxide on crystalline silicon ($polySi/SiO_2/c-Si$). More specifically, the SOI substrate includes a 1 μm-thick polySi layer over a 100 nm-thick $SiO_2$ layer on c-Si. Fabrication is carried out similarly to the prior examples, with 2 μm- and 4 μm-diameter arrays having a 2 μm spacing being patterned, and then deposited with a porous Au film of 10 nm in thickness followed by lift-off to form discrete metal features on the SOI substrate for SAC-MacEtch. As above, the array of discrete metal features (each comprising a porous gold body with through-thickness pores) is referred to as a "porous array" below.

Figure 5B:
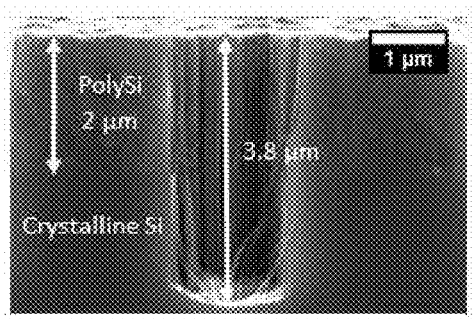
Figure 5C:
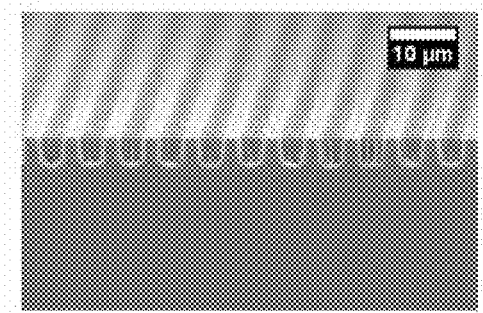
FIGS. 5C and 5D show low and high magnification images of a 4 μm-diameter, 2 μm-spacing (6 μm-pitch) via array fabricated by SAC-MacEtch under the same conditions as the array of FIGS. 5A and 5B.
Figure 5D:
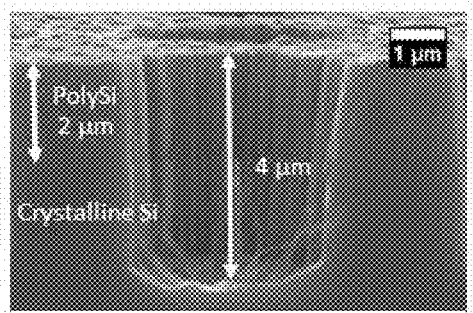

FIGS. 5A and 5B show low and high magnification cross-sectional SEM images of the 2 μm-diameter, 2 μm-spacing (4 μm-pitch) via array formed after SAC-MacEtch in an etching solution comprising 20 ml HF, 5 ml $H_2O_2$, 16 ml DI and 16 ml IPA for 15 minutes. FIGS. 5C and 5D show low and high magnification images of the 4 μm-diameter, 2 μm-spacing (6 μm-pitch) via array fabricated by SAC-MacEtch under the same conditions.

Using SAC-MacEtch, both the 2 μm-diameter and 4 μm-diameter porous arrays are etched completely through the two interfaces (between the 2 μm-thick polySi and the 100 nm-thick $SiO_2$, and between the 100 nm-thick $SiO_2$ and the c-Si substrate. Via arrays having a total depth of 3.8 μm and 4 μm, respectively, are formed without delamination or detouring of the discrete metal features. Even though the $SiO_2$ etch rate is fast (1.8 μm/min at 49% HF), lateral etching of $SiO_2$ in between the polySi and c-Si is minimal as compared to the MacEtch. On the bottom of every via, anchoring structures (nanowires), each having a length corresponding to the etched depth of the c-Si substrate, are formed through the pores in the discrete metal features (about 1.8 μm and about 2 μm for 2 μm-diameter and 4 μm-diameter features, respectively).

The minimized delamination or detouring may be attributed to the anchoring mechanism of SAC-MacEtch, as described above. The quenched $SiO_2$ lateral etching can be explained by the decreased $SiO_2$ etch rate resulting from limited mass transport; the transport of etchant and byproducts of $SiO_2$ is limited by the thickness of the $SiO_2$ as well as the consumption of HF and limited transport of byproducts resulting from MacEtch. Thus, the effective $SiO_2$ etch rate (253 nm/min and 266 nm/min for 2 μm-diameter and 4 μm-diameter porous arrays, respectively) is much smaller than the MacEtch rate. The relatively short anchoring structures formed through the pores or pinholes of the discrete metal features (which are at the bottom of the vias after etching) may be due to (1) selective polishing of polySi resulting from unconsumed hole diffusion and/or (2) polySi liftoff from the $SiO_2$ lateral etching in the anchoring structures.

SAC-MacEtch Using Large-Scale Discrete Metal Features

SAC-MacEtch can be applied to enhance vertical etching uniformity while using large-dimension discrete metal features to catalyze etching. On a 500 μm-thick p-type silicon substrate, an array of 320 μm×320 μm squares with a pitch of 740 μm are patterned by optical lithography, then a porous Au film of 10 nm in thickness and a nonporous Au film of 20 nm in thickness are deposited to form, after lift-off, porous and nonporous arrays of discrete metal features (with and without through-thickness pores, respectively) for the MacEtch comparison.

Figure 6A:
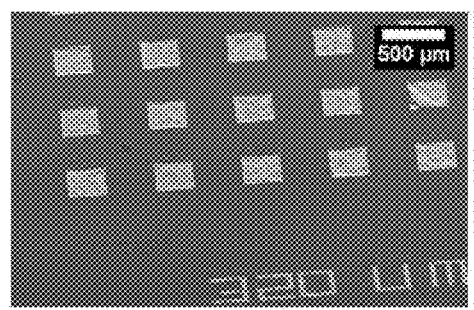
FIGS. 6A and 6B show low and high magnification 45-degree tilted SEM images of a nonporous array comprising 320 μm-width discrete metal features with a 740 μm pitch.
Figure 6B:
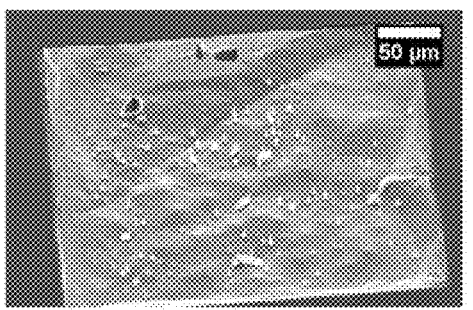
Figure 6C:
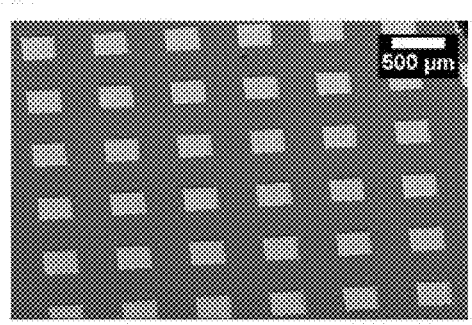
FIGS. 6C and 6D show SEM images of a porous array also comprising 320 μm-width discrete metal features with a 740 μm pitch.
Figure 6D:
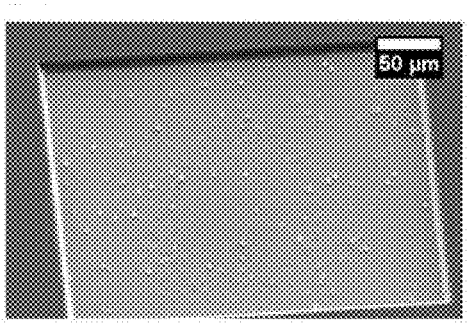
Figure 7A:
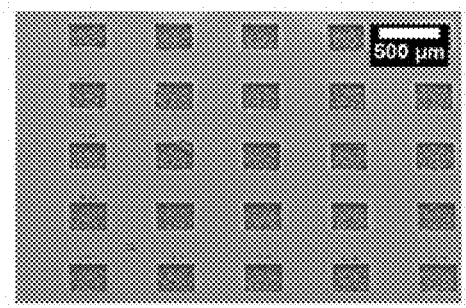
FIGS. 7A-7F show low and high magnification images of the 320 μm×320 μm porous array of FIGS. 6C and 6D after SAC-MacEtch in an etching solution comprising 20 ml HF, 30 ml $H_2O_2$, 16 ml IPA, 16 ml DI, for 1.5, 6 and 48 hours, respectively.
Figure 7B:
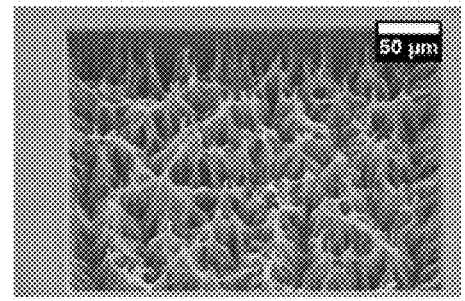
Figure 7C:
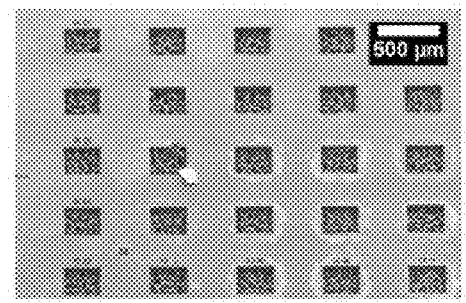
Figure 7D:
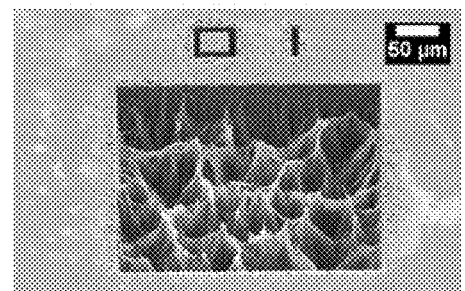
Figure 7E:
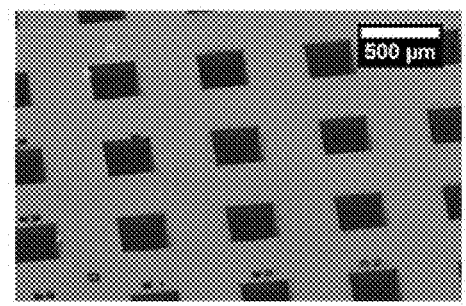
Figure 7F:
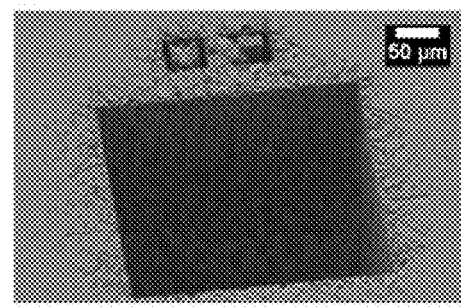

FIGS. 6A and 6B show low and high magnification 45-degree tilted SEM images of the nonporous array, and FIGS. 6C and 6D show SEM images of the porous array which is etched in an identical solution. After MacEtch, delamination, cracks, and non-uniform vertical etching across the substrate are observed in the nonporous array, while uniform vertical etching occurs in the porous array. The enhanced etching uniformity in the porous array is attributed to the enhanced mass transport and anchoring of the discrete metal features; the transport of etchant and byproducts is enhanced through the pores, and the perturbation is minimized by the anchoring structures.

FIGS. 7A-7F show low and high magnification images of the 320 μm×320 μm porous array after SAC-MacEtch in an etching solution comprising 20 ml HF, 30 ml $H_2O_2$, 16 ml IPA, 16 ml DI for 1.5 hours (FIGS. 7A and 7B), 6 hours (FIGS. 7C and 7D) and 48 hours (FIGS. 7E and 7F) respectively. The MacEtch solution is replaced every 3 hours to prevent a change in solution concentration due to evaporation and consumption. The sample etched for 1.5 hours shows a high density of anchoring structures formed through the pores. The anchoring structures appear to be clustered together due to surface tension. With longer etching times, the length of the anchoring structures decreases as a consequence of chemical polishing resulting from diffusion of excess holes.

SAC-MacEtch of Through-Silicon Vias (TSV)

Figure 8:
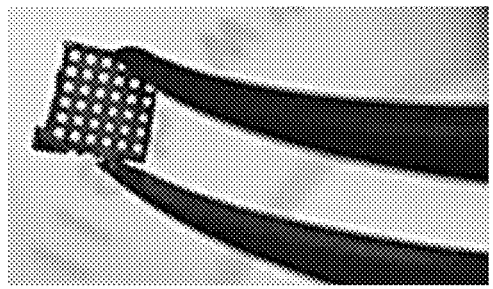
FIG. 8 shows a through-silicon via array fabricated by SAC-MacEtch using the 320 μm×320 μm porous array described above.
Figure 9A:
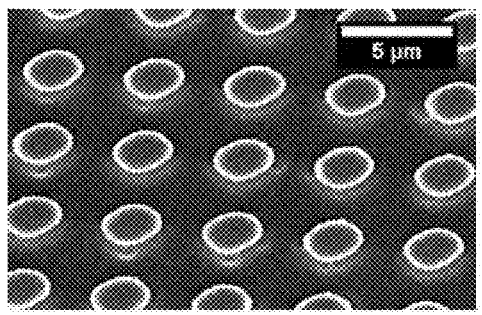
FIGS. 9A-9F show 45-degree tilted SEM images of a GaAs substrate after etching, where the GaAs substrate includes: a nonporous array etched in a low oxidant concentration solution (FIGS. 9A and 9B) for 10 minutes; a nonporous array etched in a high oxidant concentration solution (FIGS. 9C and 9D) for 10 minutes; and a porous array etched in an etching solution comprising 10 ml HF, 10 ml DI, 0.1 g $KMnO_4$ (FIGS. 9E and 9F) for 10 minutes.
Figure 9B:
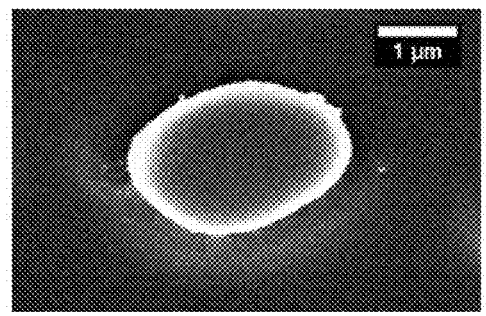
Figure 9C:
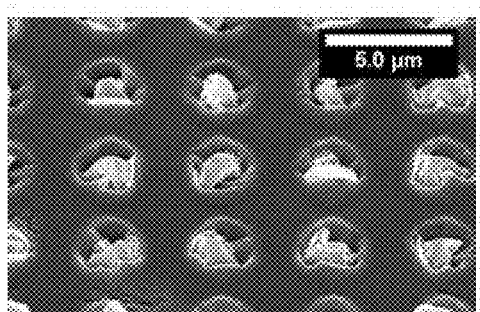
Figure 9D:
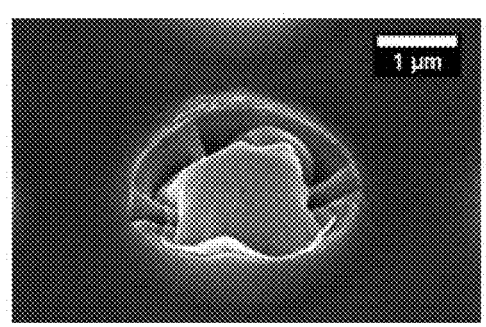
Figure 9E:
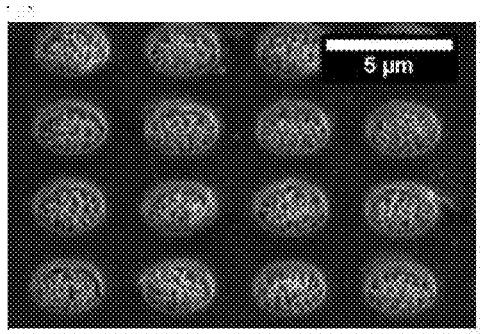
Figure 9F:
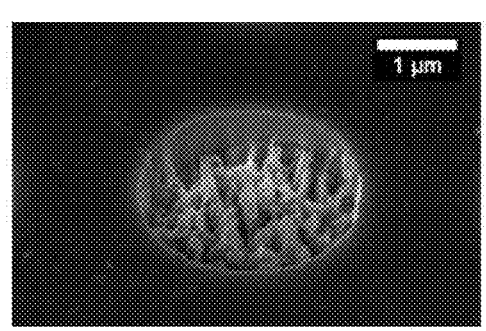

Through-silicon vias can be made using SAC-MacEtch. The 320 μm×320 μm porous array described above can be used to produce a through-silicon via array by SAC-MacEtch using the etching condition described above (20 ml HF, 30 ml $H_2O_2$, 16 ml IPA, 16 ml DI) for about 96 hours, as shown in FIG. 8.

SAC-MacEtch of Compound Semiconductors

SAC-MacEtch can be applied not only to silicon but also to compound semiconductor materials, such as III-V semiconductors.

In one example, a semi-insulating (SI) GaAs wafer is patterned with a 2 μm-diameter array having a 2 μm spacing using optical lithography. Then, a porous Au film of 10 nm in thickness and a nonporous Au film of 20 nm in thickness are deposited to form, after lift-off, porous and nonporous arrays of discrete metal features (with and without through-thickness pores, respectively) for the MacEtch comparison.

FIGS. 9A-9F shows 45-degree tilted SEM images of the GaAs substrate with: (FIGS. 9A and 9B) the nonporous array MacEtched after etching in an etching solution comprising 10 ml HF, 10 ml DI, 0.025 g $KMnO_4$ for 10 minutes (low oxidant concentration); (FIGS. 9C and 9D) the nonporous array after etching in an etching solution comprising 10 ml HF, 10 ml DI, 0.1 g $KMnO_4$ for 10 minutes (high oxidant concentration); and (FIGS. 9E and 9F) the porous array after etching in an etching solution comprising 10 ml HF, 10 ml DI, 0.1 g $KMnO_4$ for 10 minutes.

Inverse MacEtch (I-MacEtch) is observed for the nonporous array MacEtched in the etching solution having a low oxidant concentration. Here, I-MacEtch is defined as the chemical etching of the bare (uncovered by metal) GaAs regions. For the nonporous array MacEtched in the etching solution having a high oxidant concentration, forward MacEtch is observed, but the detouring of the discrete metal features is observed in every etched pore. For the porous array, the vertical etching occurs to a depth of about 600 nm with minimal detouring, and GaAs anchoring structures are formed through the through-thickness pores.

It is believed that I-MacEtch observed in the nonporous array etched at a low oxidant concentration may be due to limited mass transport. Unconsumed holes in the centers of the discrete metal features may diffuse on the bare GaAs, resulting in chemical etching while the metal acts as an etch mask. Delamination and detouring observed in the nonporous array MacEtched at a high oxidant concentration may be due to the limited transport and vigorous catalyst perturbation resulting from transport of etchant/byproducts. The uniform etching in the porous array MacEtched at a high oxidant concentration may be attributed to enhanced mass transport though pores and catalyst anchoring by the GaAs anchoring structures.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein.

Furthermore, the advantages described above are not necessarily the only advantages of the invention, and it is not necessarily expected that all of the described advantages will be achieved with every embodiment of the invention.

The invention claimed is:

1. A method of metal-assisted chemical etching, the method comprising:
    forming an array of discrete metal features on a surface of a semiconductor structure, each discrete metal feature comprising a porous metal body with a plurality of pores extending therethrough and terminating at the surface of the semiconductor structure;
    exposing the semiconductor structure to an etchant, the discrete metal features sinking into the semiconductor structure as metal-covered surface regions are etched and uncovered surface regions are extruded through the pores to form anchoring structures for the discrete metal features,
    wherein the anchoring structures inhibit detouring or delamination of the discrete metal features during etching, and wherein, during continued exposure to the etchant, the anchoring structures are gradually removed, thereby leaving an array of holes in the semiconductor structure.

2. The method of claim 1, wherein the holes extend partway through the semiconductor structure.

3. The method of claim 1, wherein the holes extend entirely through the semiconductor structure.

4. The method of claim 1, wherein each of the discrete metal features has a width or diameter in a range from about 50 nm to about 1,000 microns.

5. The method of claim 4, wherein the width or diameter is in the range from about 50 nm to less than 50 microns.

6. The method of claim 4, wherein the width or diameter is in the range from about 50 microns to about 1,000 microns.

7. The method of claim 1, wherein a thickness of each of the discrete metal features is in a range from about 1 nm to about 20 nm.

8. The method of claim 1, wherein the pores are present at a pore areal density from about 5% to about 30% in each of the discrete metal features.

9. The method of claim 1, wherein each of the anchoring structures has a thickness in a range from about 5 nm to about 500 nm.

10. The method of claim 1, wherein forming the array of discrete metal features on the surface comprises depositing and patterning a porous metal film on the surface.

11. The method of claim 10, wherein patterning the porous metal film comprises:
  depositing a polymer coating on the surface of the semiconductor structure;
  lithographically patterning the polymer coating to include an array of discrete shapes;
  after the lithographic patterning, depositing the porous metal film on the polymer coating; and
  lifting off one or more exposed or unexposed portions of the polymer coating, thereby patterning the porous metal film and forming the array of discrete metal features on the surface.

12. The method of claim 10, wherein depositing the porous metal film comprises employing a vapor deposition method selected from the group consisting of: thermal evaporation and sputtering.

13. The method of claim 10, wherein the depositing is carried out at a rate of at least about 0.2 angstroms per second.

14. The method of claim 10, wherein depositing the porous metal film comprises:
  depositing an alloy film comprising a mixture of a first metal and a second metal, the first and second metals being immiscible, the alloy film comprising islands of the first metal in the second metal; and
  etching to remove the islands of the first metal, thereby forming the porous metal film.

15. The method of claim 1, wherein the discrete metal features comprise one or more metals from the group consisting of: Ag, Al, Au, Co, Cr, Cu, Fe, Hf, Ir, Mn, Mo, Pd, Pt, Rb, Re, Rh, Ta, Ti, V, W, Zn and Zr.

16. The method of claim 1, wherein the semiconductor structure comprises one or more semiconductors selected from the group consisting of: Si, Ge, GaAs, InAs, InSb, GaN, GaP, GaSb, GaAsP, GaAsN, GaInAs, GaInP, AIGaAs, AIGain, AIGaP, AlGaInP, InGaAs, InGaN, InGaP, InGaSb, InAsSb, AIN, AIGaN, ZnSe, diamond (C), $Ga_2O_3$ and SiC.

17. The method of claim 1, wherein the semiconductor structure comprises at least one interface, and wherein etching occurs across the at least one interface.

18. The method of claim 1, wherein etching occurs at an etch rate from about 10 nm/min to about 10 micron/min.

19. The method of claim 1, wherein etching is carried out for a time duration from about 1 minute to about 100 hours.

20. The method of claim 1, wherein the etchant comprises:
  an acid selected from the group consisting of: HF and $H_2SO_4$; and
  an oxidant selected from the group consisting of: $H_2O_2$, $KMnO_4$, and $K_2S_2O_8$.

* * * * *